United States Patent
Lin et al.

(10) Patent No.: US 12,260,913 B2
(45) Date of Patent: Mar. 25, 2025

(54) HYPERDIMENSIONAL COMPUTING DEVICE

(71) Applicant: MACRONIX International Co., Ltd., Hsinchu (TW)

(72) Inventors: Yu-Hsuan Lin, Taichung (TW); Po-Hao Tseng, Taichung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 199 days.

(21) Appl. No.: 18/166,484

(22) Filed: Feb. 9, 2023

(65) Prior Publication Data

US 2024/0274199 A1    Aug. 15, 2024

(51) Int. Cl.
| | |
|---|---|
| G11C 5/00 | (2006.01) |
| G11C 16/04 | (2006.01) |
| G11C 16/08 | (2006.01) |
| G11C 16/26 | (2006.01) |

(52) U.S. Cl.
CPC .......... *G11C 16/08* (2013.01); *G11C 16/0483* (2013.01); *G11C 16/26* (2013.01)

(58) Field of Classification Search
CPC ....... G11C 5/063; G11C 7/18; G11C 11/4097; G11C 5/025; G11C 5/04
USPC ............................................... 365/63, 230.03
See application file for complete search history.

(56) References Cited

U.S. PATENT DOCUMENTS

| | | | |
|---|---|---|---|
| 10,460,817 B2 | 10/2019 | Li et al. | |
| 10,762,957 B2 * | 9/2020 | Chen | G11C 13/0002 |
| 2012/0221775 A1 * | 8/2012 | Kim | G11C 11/5642 |
| | | | 711/E12.008 |
| 2014/0143473 A1 * | 5/2014 | Kim | G11C 16/16 |
| | | | 711/103 |
| 2019/0164600 A1 * | 5/2019 | Castro | G11C 13/0069 |

FOREIGN PATENT DOCUMENTS

| | | |
|---|---|---|
| CN | 109213614 | 3/2022 |
| TW | I718626 | 2/2021 |
| TW | 202147311 | 12/2021 |
| TW | 202211216 | 3/2022 |

OTHER PUBLICATIONS

Lu Lu Ge et al., "Classification using Hyperdimensional Computing: A Review," IEEE Circuits and Systems Magazine, Apr. 2020, pp. 1-16.
"Office Action of Taiwan Counterpart Application", issued on Sep. 13, 2023, pp. 1-5.

* cited by examiner

*Primary Examiner* — Son T Dinh
(74) *Attorney, Agent, or Firm* — J.C. PATENTS

(57) ABSTRACT

A hyperdimensional computing device includes a non-volatile memory cell array and a first operation circuit. The non-volatile memory cell array is coupled to a plurality of first word lines. The non-volatile memory cell array has a plurality of memory cell groups, a plurality of first memory cells of each of the memory cell groups are coupled to a same first word line of the first word lines, and the memory cell groups respectively store a plurality of data vectors. The first operation circuit receives at least one of the data vectors through bit lines and generates a bundled data vector according to the at least one of the data vectors.

14 Claims, 12 Drawing Sheets

HYPERDIMENSIONAL COMPUTING DEVICE

BACKGROUND

Technical Field

The disclosure relates to a hyperdimensional (HD) computing device; more particularly, the disclosure relates to a hyperdimensional computing device implemented by a non-volatile memory.

Description of Related Art

Hyperdimensional computing refers to computational operations carried out in thousands of dimensions. During data transformation, hyperdimensional computing may aim at adding, multiplying, and permutating data, where the data addition may be performed based on the majority rule, the data multiplication may be performed through XOR operations, and data permutation is to permutate the data on certain operands. The hyperdimensional computing is to compute hyperdimensional data vectors, generate training data, and classify and stored the training data in an associative memory. According to the related art, a number of logic circuits may be applied to perform the hyperdimensional computing operations, and such hyperdimensional computing devices are often required to have complicated circuit structures and may consume a significant amount of power during computation.

SUMMARY

The disclosure relates to a hyperdimensional computing device implemented by a flash memory.

According to an embodiment of the disclosure, a hyperdimensional computing device includes a memory cell array and a first operation circuit. The memory cell array is coupled to a plurality of first word lines and has a plurality of memory cell groups, a plurality of first memory cells of each of the memory cell groups are coupled to a same first word line of the first word lines, and the memory cell groups respectively store a plurality of data vectors. The first operation circuit receives at least one of the data vectors through bit lines and generates a bundled data vector according to the at least one of the data vectors.

In view of the above, in the hyperdimensional computing device provided in one or more embodiments of the disclosure, the data vectors are stored in the memory cell groups of the non-volatile memory cell array, and the corresponding bundle data vector may be generated through providing one of the data vectors to the operation circuit. Through in-memory-computing and in-memory-searching operations, the hyperdimensional computing device provided in one or more embodiments of the disclosure performs hyperdimensional computing operations and generates the bundle data vector, which may effectively lower the requirements for circuit devices, reduce power consumption, and improve the hyperdimensional computing performance.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6A to FIG. 6C are schematic views illustrating operations of a hyperdimensional computing device according to another embodiment of the disclosure.

DESCRIPTION OF THE EMBODIMENTS

Figure 1:
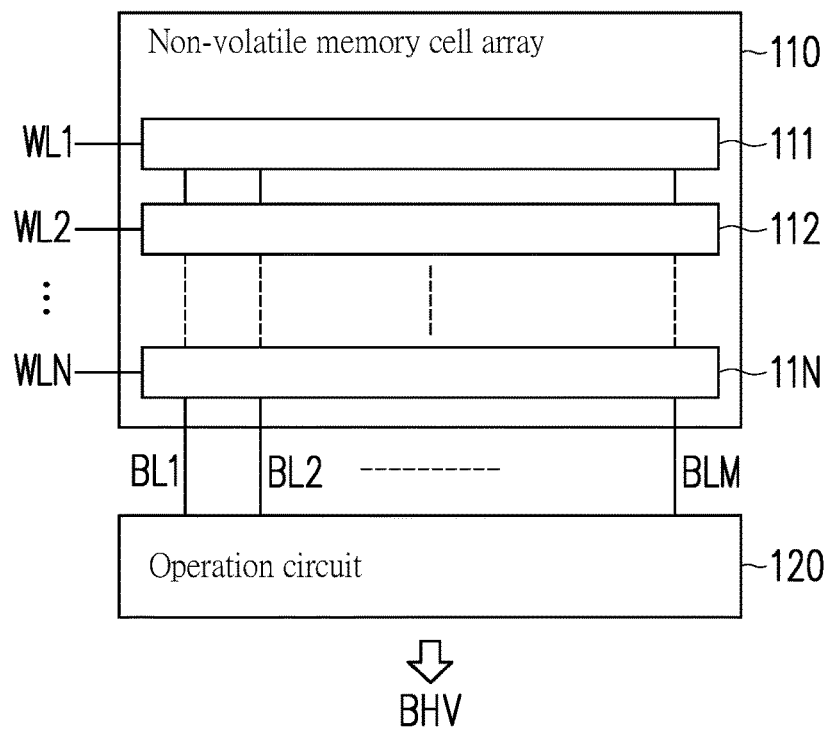
FIG. 1 is a schematic view of a hyperdimensional computing device according to an embodiment of the disclosure.

Please refer to FIG. 1, which is a schematic view of a hyperdimensional computing device according to an embodiment of the disclosure. A hyperdimensional computing device 100 includes a non-volatile memory cell array 110 and an operation circuit 120. The non-volatile memory cell array 110 and the operation circuit 120 are coupled to each other. The non-volatile memory cell array 110 is coupled to a plurality of word lines WL1-WLN and a plurality of bit lines BL1-BLM. The non-volatile memory cell array 110 has a plurality of memory cell groups 111-11N. The memory cell groups 111-11N are respectively coupled to the word lines WL1-WLN. Each of the memory cell groups 111-11N may have a plurality of memory cells. Wherein, each of the memory cell groups 111-11N may store a data vector.

The operation circuit 120 is coupled to the bit lines BL1-BLM of the non-volatile memory cell array 110. The operation circuit 120 receives the data vector provided by at least one of the memory cell groups 111-11N through the bit lines BL1-BLM. The operation circuit 120 may integrate the received one or more data vectors and accordingly generate a bundled data vector BHV.

In this embodiment, the data vector stored by each of the memory cell groups 111-11N may be an n-gram vector. The data vectors respectively recorded in the memory cell groups 111-11N may include all permutations and combinations of a plurality of characters. Specifically, for instance, each data vector includes three English-alphabet-characters, and the data vectors respectively recorded in the memory cell groups 111-11N may be: aaa, aab, aac, . . . , and zzz in the number of $26^3$. Certainly, in other embodiments of the disclosure, each data vector not only includes English-alphabet-characters but also includes special characters (such as space, underscores, punctuation marks) and/or numerical characters, which should however not be construed as limitations in the disclosure. The number of characters recorded in each data vector may be determined by a user and is not limited to 3.

In other embodiments of the disclosure, the data vectors respectively recorded by the memory cell groups 111-11N may also be a plurality of data and a plurality of positions respectively corresponding to the data. The data and the corresponding positions together constitute a graphic image. Here, the data may serve to indicate grayscale information of pixels on the positions corresponding to the data in the graphic image.

In this embodiment, when the bundled data vector BHV is to be generated, at least one of the word lines WL1-WLN may be selected. The hyperdimensional computing device 100 may enable the selected word lines to be turned on one by one or synchronously turned on together. Thereby, the operation circuit 120 may generate the bundled data vector BHV according to at least one data vector provided by the memory cell groups corresponding to the selected word lines.

According to this embodiment, the memory cells in the memory cell groups 111-11N are all non-volatile memory cells, such as flash memory cells, ferroelectric random access memory (FeRAM) cells, resistive memory cells, phase change memory (PCM) memory cells, or conductive-bridging random access memory (CBRAM) cells. The flash memory cell may be a floating gate flash memory cell, a silicon-oxide-nitride-oxide-silicon (SONOS) flash memory cell, or a floating dot flash memory cell, which should not be construed as a limitation in the disclosure. In addition, the non-volatile memory cell array 110 may be a two-dimensional or three-dimensional stacked memory cell array, which should not be construed as a limitation in the disclosure.

Figure 2:
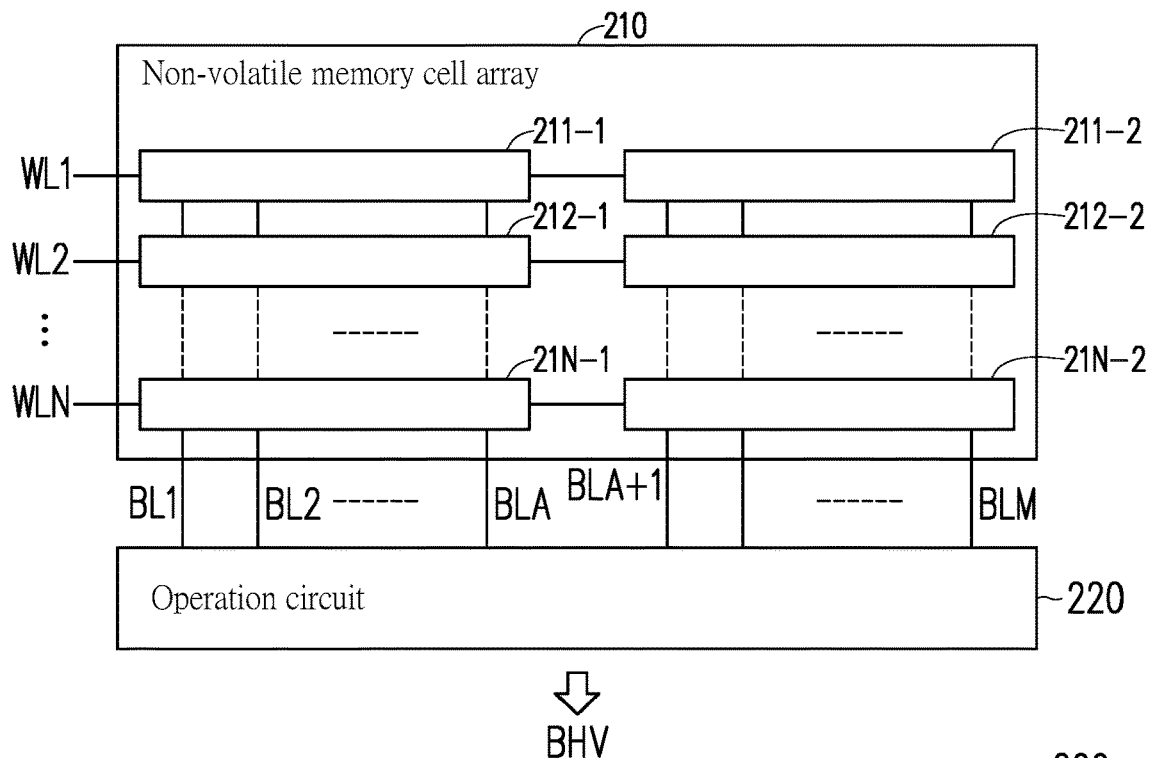
FIG. 2 is a schematic view of a hyperdimensional computing device according to another embodiment of the disclosure.

Please refer to FIG. 2, which is a schematic view of a hyperdimensional computing device according to another embodiment of the disclosure. A hyperdimensional computing device 200 includes a non-volatile memory cell array 210 and an operation circuit 220. The non-volatile memory cell array 210 and the operation circuit 220 are coupled to each other. The non-volatile memory cell array 210 is coupled to the word lines WL1-WLN and the bit lines BL1-BLM. The non-volatile memory cell array 210 has a plurality of memory cell groups 211-1-21N-2. Different from the embodiment shown in FIG. 1, the present embodiment provides that a memory cell row corresponding to one word line may be divided into a plurality of memory cell groups. For instance, the memory cell row corresponding to word line WL1 may be divided into the memory cell groups 211-1 and 211-2; the memory cell row corresponding to the word line WL2 may be divided into the memory cell groups 212-1 and 212-2; . . . ; the memory cell row corresponding to the word line WLN may be divided into the memory cell groups 21N-1 and 21N-2. Here, each of the memory cell groups 211-1-21N-2 may store one data vector.

The operation circuit 220 is coupled to the memory cell groups 211-1-21N-1 through the bit lines BL1-BLA, and the operation circuit 220 is coupled to the memory cell groups 211-2-21N-2 through the bit lines BLA+1-BLM. The operation circuit 220 may receive the data vector recorded by at least one of the memory cell groups 211-1-21N-1 through the bit lines BL1-BLA, receive the data vector recorded by at least one of the memory cell groups 211-2-21N-2 through the bit lines BLA+1-BLM, and thereby generate the bundled data vector BHV.

Figure 3:
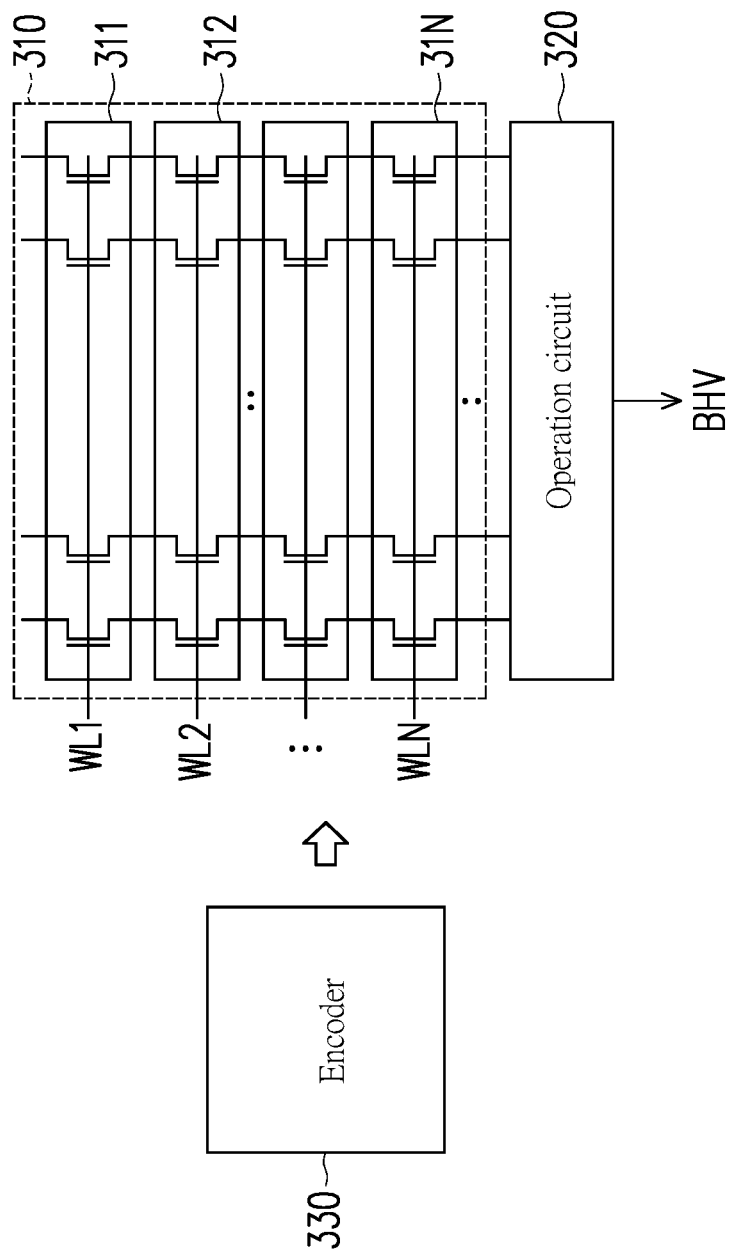
FIG. 3 is a schematic view of a hyperdimensional computing device according to another embodiment of the disclosure.

Please refer to FIG. 3, which is a schematic view of a hyperdimensional computing device according to another embodiment of the disclosure. A hyperdimensional computing device 300 includes a non-volatile memory cell array 310, an operation circuit 320, and an encoder 330. The non-volatile memory cell array 310 is coupled to the word lines WL1-WLN and coupled to the operation circuit 320. The non-volatile memory cell array 310 corresponding to the word lines WL1-WLN includes a plurality of memory cell groups 311-31N, and each of the memory cell groups 311-31N includes a plurality of NAND flash memory cells and is configured to store a data vector.

The operation circuit 320 is coupled to the non-volatile memory cell array 310 through a plurality of bit lines. The operation circuit 320 receives at least one of the data vectors through the bit lines and generates the bundled data vector BHV according to at least one of the data vectors.

According to an embodiment of the disclosure, in the application of string processing, the encoder 330 may be configured to generate a plurality of n-gram vectors and respectively store the generated n-gram vectors into the memory cell groups 311-31N. The encoder 330 may generate all possible combinations of the n-gram vectors corresponding to a plurality of characters through permutations and combinations and respectively store all the possible combinations in the memory cell groups 311-31N.

According to another embodiment of the disclosure, in the application of graphic image processing, the encoder 330 may analyze a plurality of positions of a graphic image and respectively store all possible component information corresponding to all the positions in the graphic image and the corresponding position information corresponding in the memory cell groups 311-31N. The possible component information may be the grayscale information of a pixel at a position in the graphic image. Here, one single possible component information and the corresponding position information may be recorded in the same one of the memory cell groups 311-31N.

Figure 4:
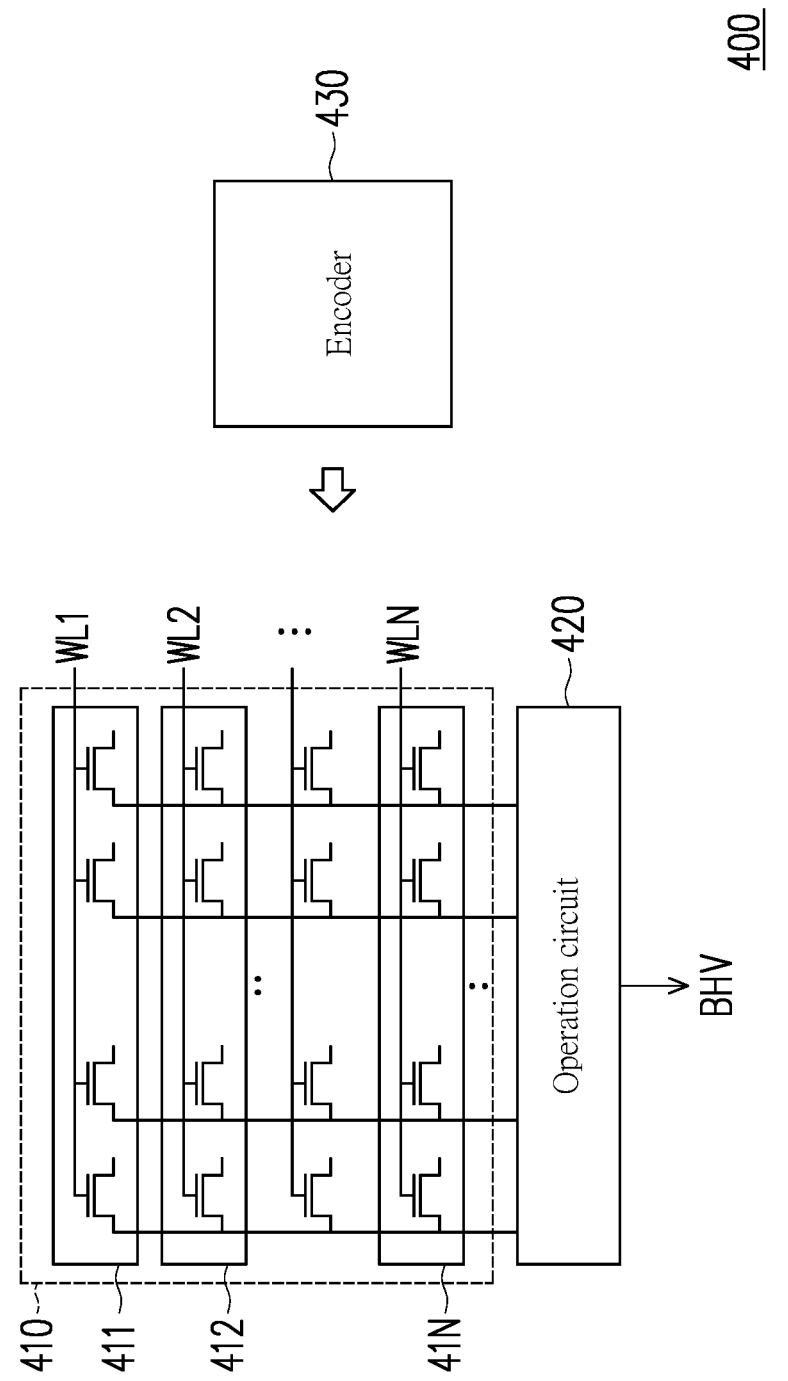
FIG. 4 is a schematic view of a hyperdimensional computing device according to another embodiment of the disclosure.

Please refer to FIG. 4, which is a schematic view of a hyperdimensional computing device according to another embodiment of the disclosure. A hyperdimensional computing device 400 includes a non-volatile memory cell array 410, an operation circuit 420, and an encoder 430. The non-volatile memory cell array 410 is coupled to the word lines WL1-WLN and coupled to the operation circuit 420. The non-volatile memory cell array 410 includes memory cell groups 411-41N corresponding to the word lines WL1-WLN. Compared to the embodiment shown in FIG. 3, the present embodiment provides the hyperdimensional computing device 400 in which each of the memory cell groups 411-41N of the non-volatile memory cell array 410 includes a plurality of NOR flash memory cells and is configured to store one data vector.

In this embodiment, the encoder 430 may be configured to perform the same operations as the operations performed by the encoder 330, and thus no further description is provided hereinafter.

Figure 5A:
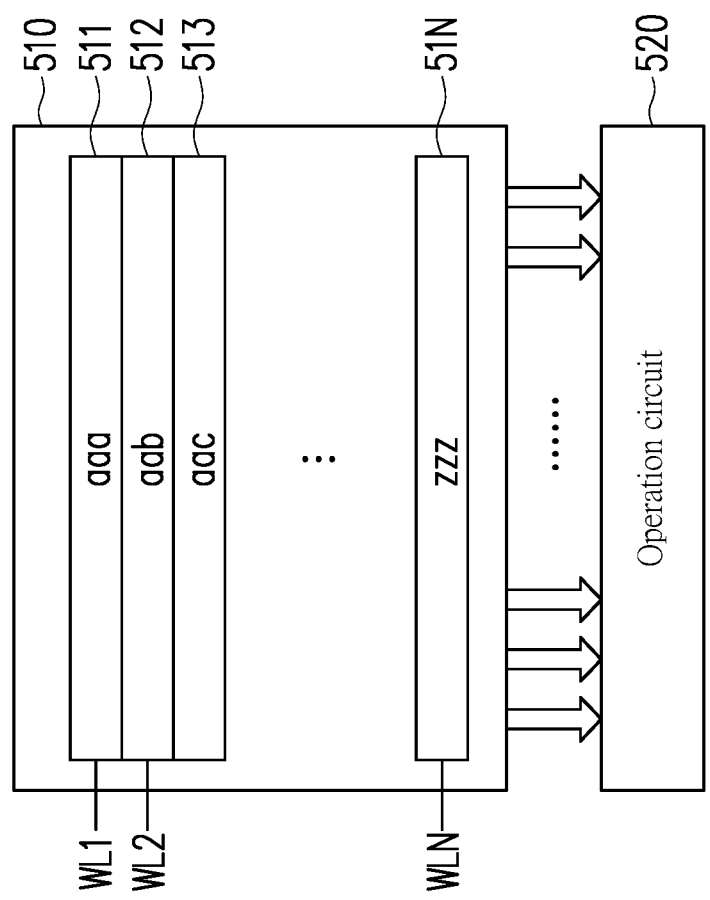
FIG. 5A to FIG. 5C are schematic views illustrating operations of a hyperdimensional computing device according to an embodiment of the disclosure.
Figure 5B:
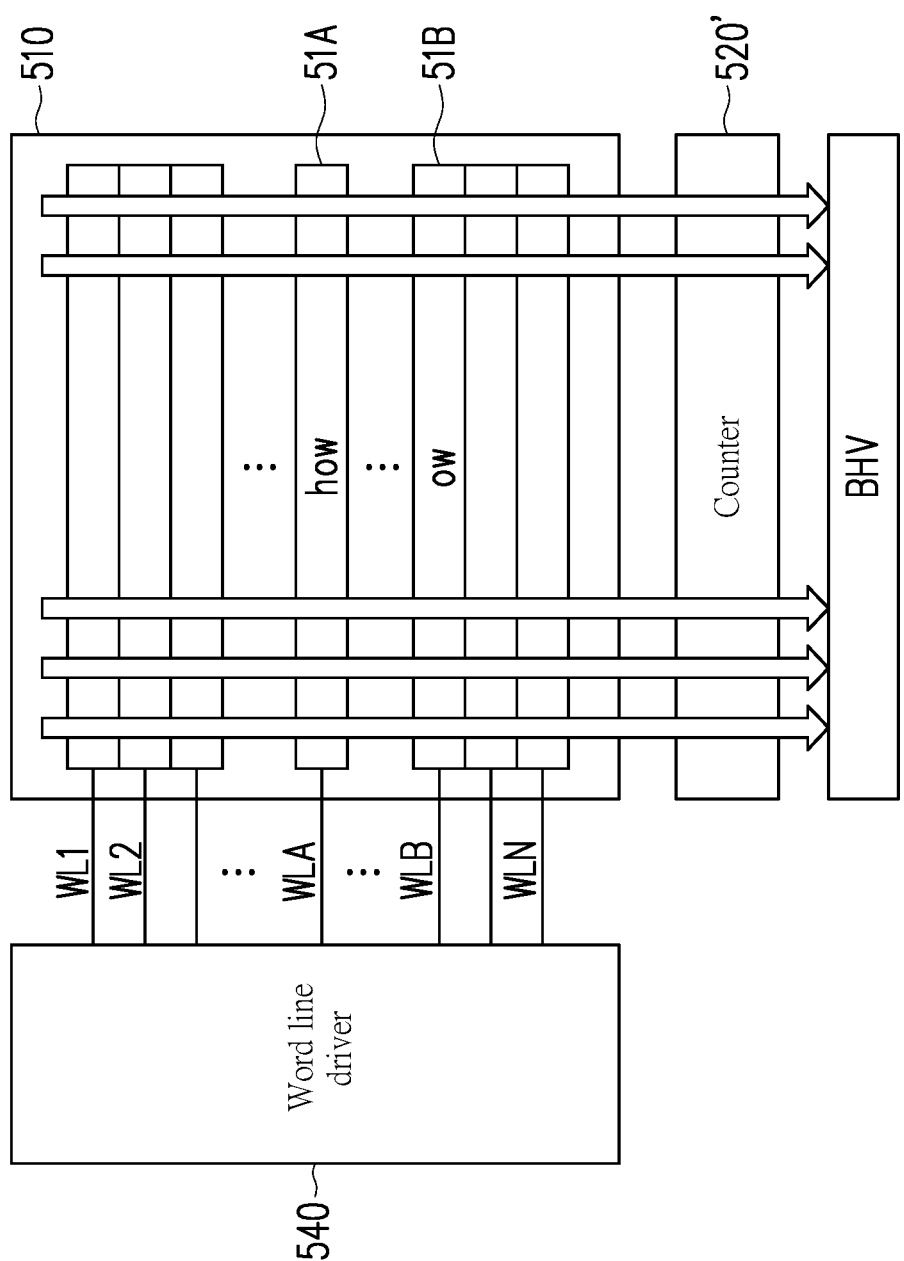
Figure 5C:
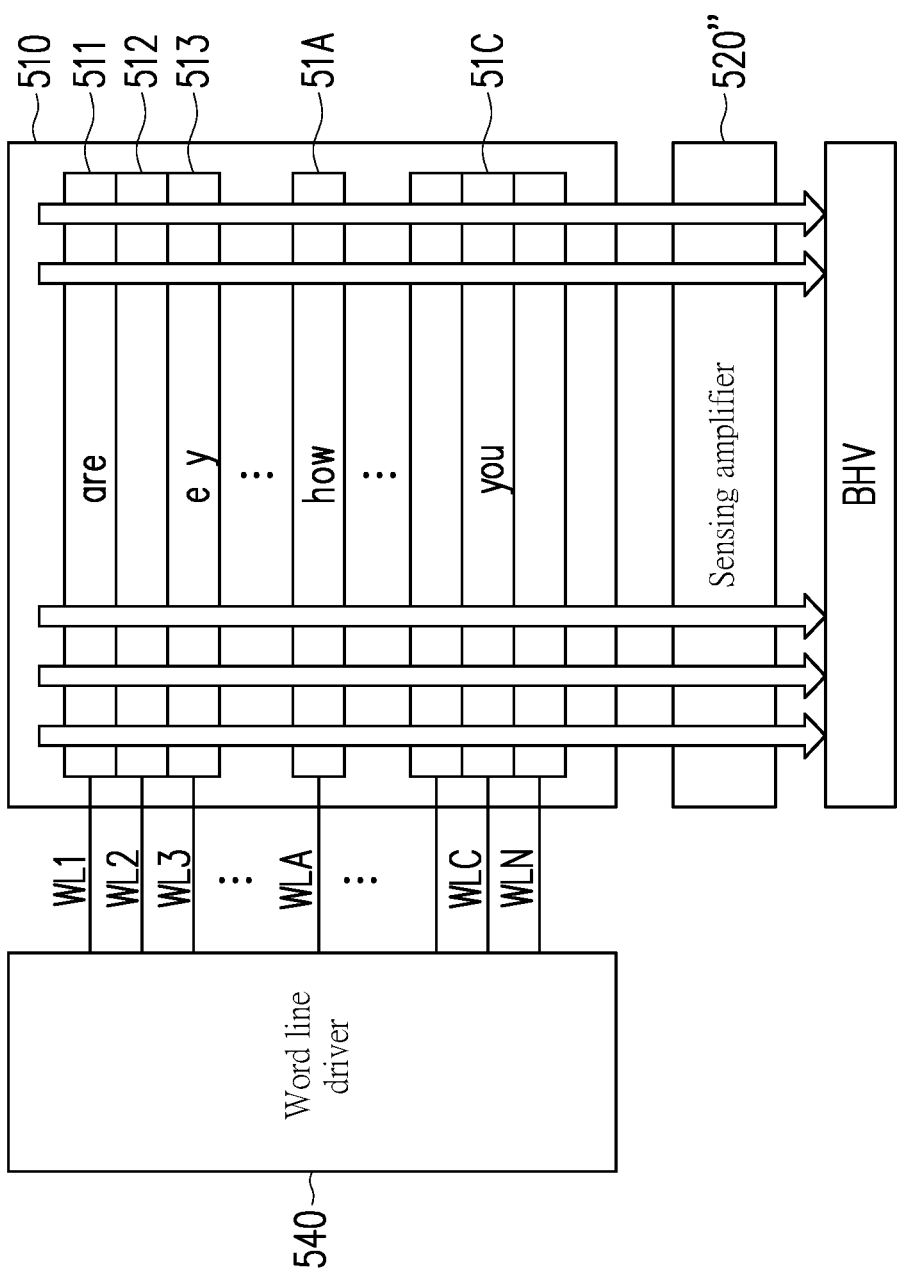

Please refer to FIG. 5A to FIG. 5C, which are schematic views illustrating operations of a hyperdimensional computing device according to an embodiment of the disclosure. In FIG. 5A, a hyperdimensional computing device 500 includes a non-volatile memory cell array 510 and an operation circuit 520. The non-volatile memory cell array 510 includes memory cell groups 511-51N corresponding to the word lines WL1-WLN, respectively. The memory cell groups 511-51N respectively record a plurality of trigram vectors, e.g., aaa, aab, aac, . . . zzz. The trigram vectors respectively recorded in the memory cell groups 511-51N include all permutations and combinations which may be generated by three English-alphabet-characters and space.

In FIG. 5B, the hyperdimensional computing device 500 further includes a word line driver 540, and the operation circuit 520 may be implemented in form of a counter 520'. When the bundled data vector BHV is to be generated by the hyperdimensional computing device 500, the word line driver 540 may generate one or a plurality of selected word lines according to input data and enable at least one of the memory cell groups 511-51N to provide the recorded data vector to the counter 520' through turning on the selected word line(s). The counter 520' may generate the bundled data vector BHV according to the received at least one data vector.

For instance, it is assumed that the input data are a string "how are you" having 11 characters (k=11), and the word line driver 540 may generate a plurality of selected word lines according to the input data, where the number of the selected word lines may be greater than k/2. Next, the word line driver 540 may sequentially turn on the selected word lines one by one; for instance, the word line driver 540 may turn on the word line WLA acting as the selected word line and enable the corresponding memory cell group 51A to output the data vector equivalent to "how" to the counter 520'. The counter 520' may correspondingly increase a count value by 1 (an initial value of the count value may be equal to 0). Next, the word line driver 540 may turn on the next word line WLB acting as the selected word line and enable the corresponding memory cell group 51B to output the data vector equivalent to "ow" to the counter 520', and the counter 520' may correspondingly set the count value equal to 2. The rest may be deduced from the above, the word line driver 540 may sequentially turn on at least 5 selected word lines, and the counter 520' may create the bundled data vector BHV corresponding to the input data according to the sequentially received data vectors and the corresponding count values.

In this embodiment, space (" ") is also considered as a character in the data vector. Hence, the memory cell groups 511-51N may respectively record $27^3$ data vectors.

As shown in FIG. 5C, in another embodiment of the disclosure, the operation circuit 520 may be implemented in form of a sensing amplifier 520". When the bundled data vector BHV is to be generated by the hyperdimensional computing device 500, the word line driver 540 may generate one or a plurality of selected word lines according to the input data and enable the memory cell groups corresponding to the selected word line(s) to provide the recorded at least one data vector to the sensing amplifier 520" through simultaneously turning on all of the selected word line(s). The sensing amplifier 520" may generate the bundled data vector BHV according to the received at least one data vector.

Following the above embodiment, it is assumed that the input data are a string "how are you" having 11 characters (k=11), and the word line driver 540 may generate a plurality of selected word lines according to the input data, such as the word lines WL1, WL3, WLA, and WLC. The word line driver 540 may turn on the word lines WL1, WL3, WLA, and WLC at the same time. Here, the data vector recorded by the memory cell group 511 corresponding to the word line WL1 is "are"; the data vector recorded by the memory cell group 513 corresponding to the word line WL3 is "e y" (there is a space between e and y); the data vector recorded by the memory cell group 51A corresponding to the word line WLA is "how"; the data vector recorded by the memory cell group 51C corresponding to the word line WLC is "you".

Correspondingly, the sensing amplifier 520" may set a current threshold TH according to the value of k, where the current threshold TH=k/2 multiplied by a readout current generated when the stored data of the memory cell are logic "1". The sensing amplifier 520" compares the current threshold TH with the total value of the currents generated by the memory cell groups 511, 513, 51A, and 51C corresponding to the selected word lines (the word lines WL1, WL3, WLA, and WLC), and thereby generates the bundled data vector BHV.

Figure 6A:
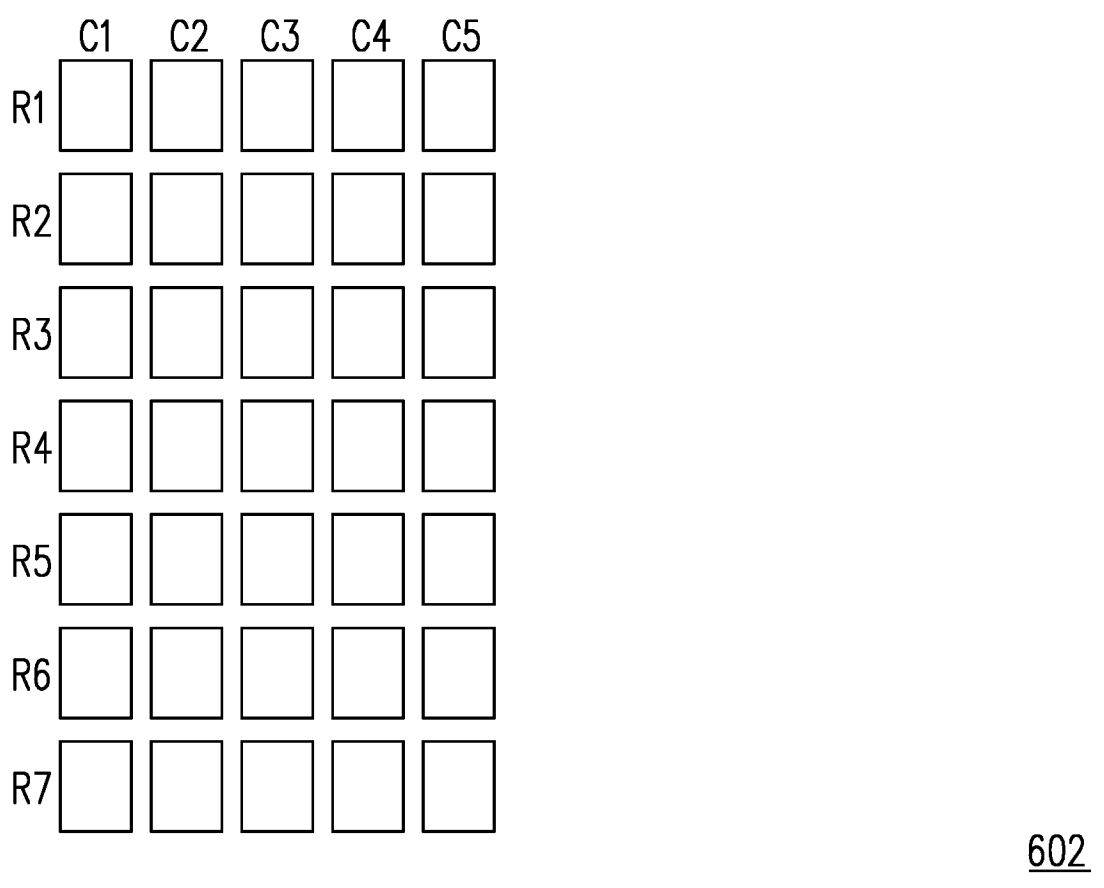
Figure 6B:
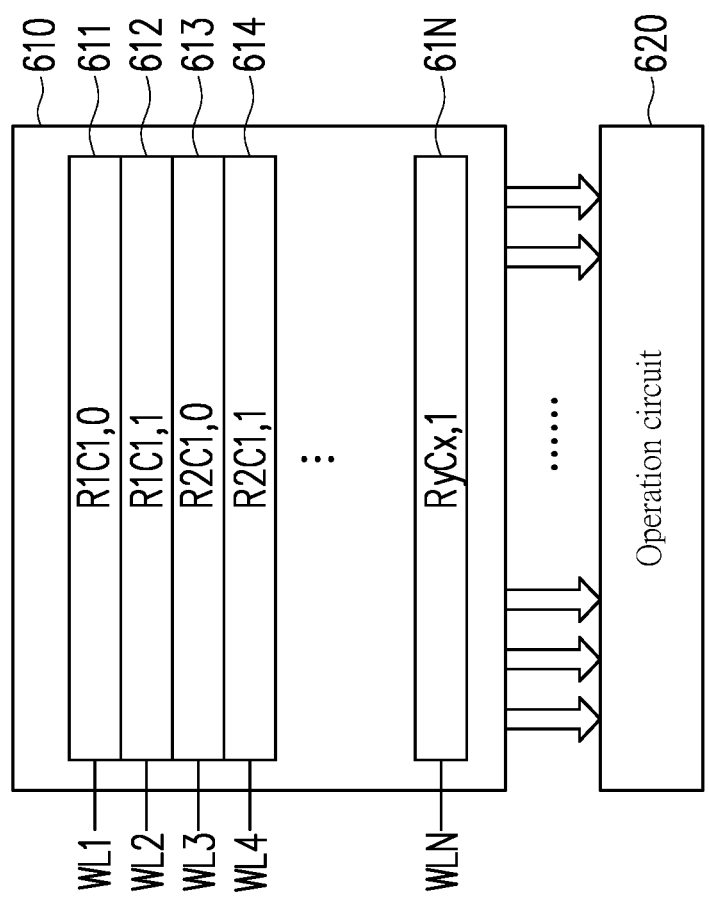
Figure 6C:
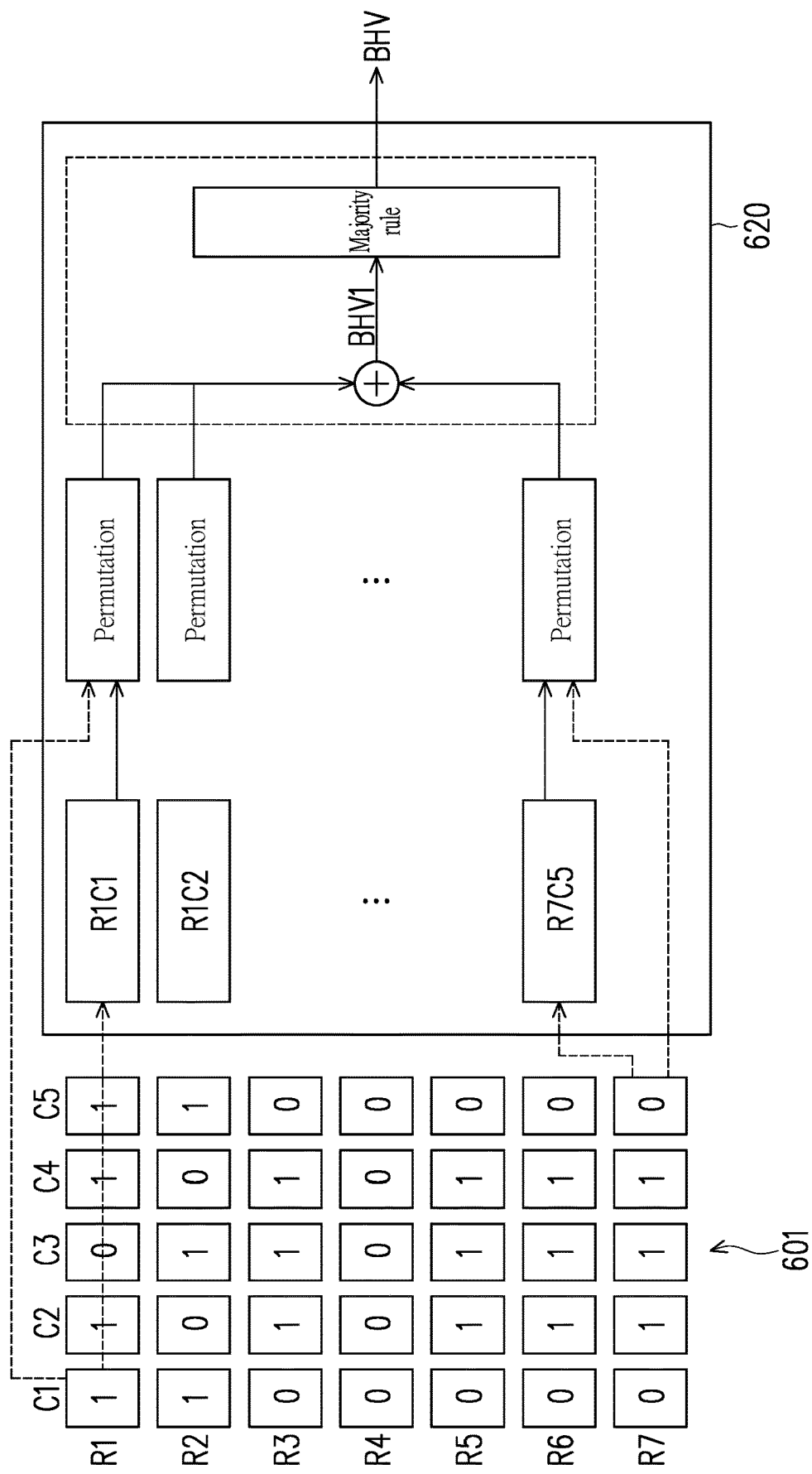

Please refer to FIG. 6A to FIG. 6C, which are schematic views illustrating operations of a hyperdimensional computing device according to another embodiment of the disclosure. In this embodiment, a hyperdimensional computing device 600 may perform computations on a graphic image 602 shown in FIG. 6A. The graphic image 602 may be divided into 35 partitions defined by 5 columns C1-C5 and 7 rows R1-R7. Each of the partitions has corresponding position information. In response to the content of the graphic image 602, each of the partitions has corresponding component information. In this embodiment, the component information may be the grayscale information corresponding to the partitions.

In FIG. 6B, the hyperdimensional computing device 600 includes a non-volatile memory cell array 610 and an operation circuit 620. The non-volatile memory cell array 610 includes memory cell groups 611-61N corresponding to the word lines WL1-WLN, respectively. The memory cell groups 611-61N may serve to record the position information corresponding to all of the partitions in the graphic image 602 and all corresponding possible component information. A monochrome is taken as an example, where the grayscale information of all of the partitions in the graphic image 602 may be 1 and 0. Hence, in this embodiment, the memory cell group 611 may record the position information R1C1 and the corresponding possible component information 0; the memory cell group 612 may record the position information R1C1 and the corresponding possible component information 1; the memory cell group 613 may record the position information R2C1 and the corresponding possible component information 0; the memory cell group 614 may record the position information R2C1 and the corresponding possible component information 1; . . . ; the memory cell group 61N may record the position information RyCx and the corresponding possible component information 1. The contents recorded by other memory cell groups may be deduced therefrom.

Next, in FIG. 6C, during the computations, the word line driver in the hyperdimensional computing device 600 may set a plurality of selected word lines according to the input data 601 and provide the position information and the corresponding possible component information to the operation circuit 620 by turning on the selected word lines. In this embodiment, the input data 601 may be a graphic image of the English character "A". The component information corresponding to different position information R1C1-R7C5 may be 0 or 1.

The position information R1C1 is taken as an example, and the component information corresponding to the position information R1C1 in the input data 601 is 1; hence, the word line WL2 may be set as the selected word line. The position information R2C1 is further taken as an example, and the component information corresponding to the position information R2C1 in the input data 601 is 1. Hence, the word line WL4 may be set as the selected word line. The rest of the setting methods of the selected word lines may be deduced in the same manner and will not be described one by one.

Through turning on the selected word lines, the operation circuit 620 may permutate the plurality of component information of received position information R1C1~R7C5 to generate the bundled data vector BHV1. In here, the operation circuit 620 may determine to shift each of the position information R1C1~R7C5 according to whether the component information thereof is 1 or not. For example, the component information is 0, which means the corresponding position information does not need to be shifted. The component information is 1, which means the corresponding position information needs to be shifted.

According to the present embodiment, in order to improve the accuracy of computations, a majority rule may be added to the operation circuit 620, and by comparing the computation results of the bundled data vector BHV1, the bundled data vector BHV1 with the most occurrences is retrieved as the final output bundled data vector BHV, whereby the accuracy of computations may be effectively improved.

Figure 7:
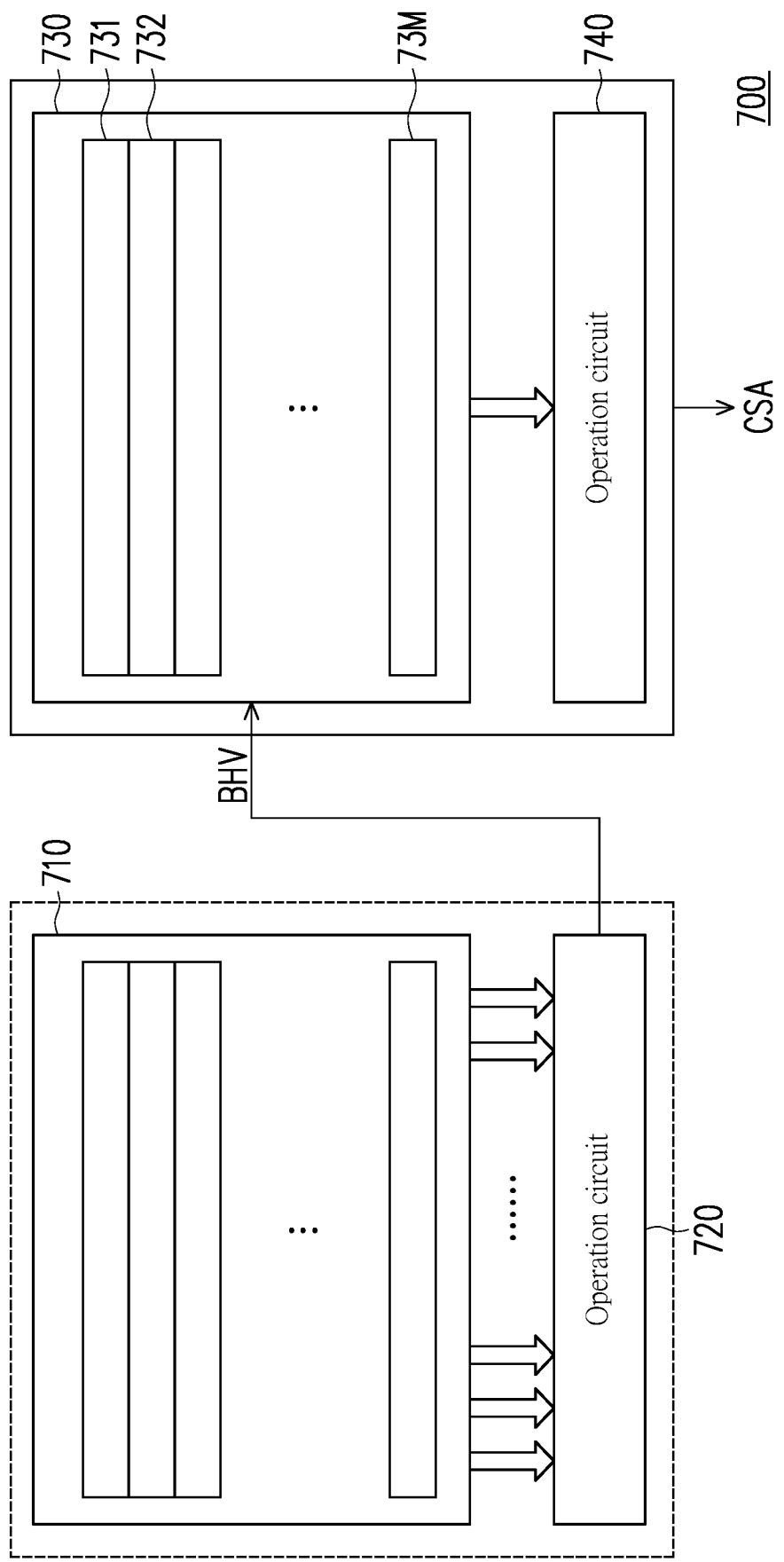
FIG. 7 is a schematic view of a hyperdimensional computing device according to another embodiment of the disclosure.

Please refer to FIG. 7, which is a schematic view of a hyperdimensional computing device according to another embodiment of the disclosure. A hyperdimensional computing device 700 includes a non-volatile memory cell array 710, operation circuits 720 and 740, and an associative memory array 730. The non-volatile memory cell array 710 and the operation circuit 720 are coupled to each other. Implementation details of the non-volatile memory cell array 710 and the operation circuit 720 have been elaborated in the previous embodiments and the implementation manner provided above, and therefore no further description will be provided hereinafter.

The operation circuit 740 and the associative memory array 730 are coupled to each other. The associative memory array 730 has a plurality of memory cell groups 731-73M. Each of the memory cell groups 731-73M has a plurality of memory cells and serves to record classification information. The associative memory array 730 serves to receive the bundled data vector BHV generated by the non-volatile memory cell array 710 and the operation circuit 720 and generate an optimal similar result CSA by performing an in-memory-searching (IMS) operation according to the bundled data vector BHV.

Figure 8A:
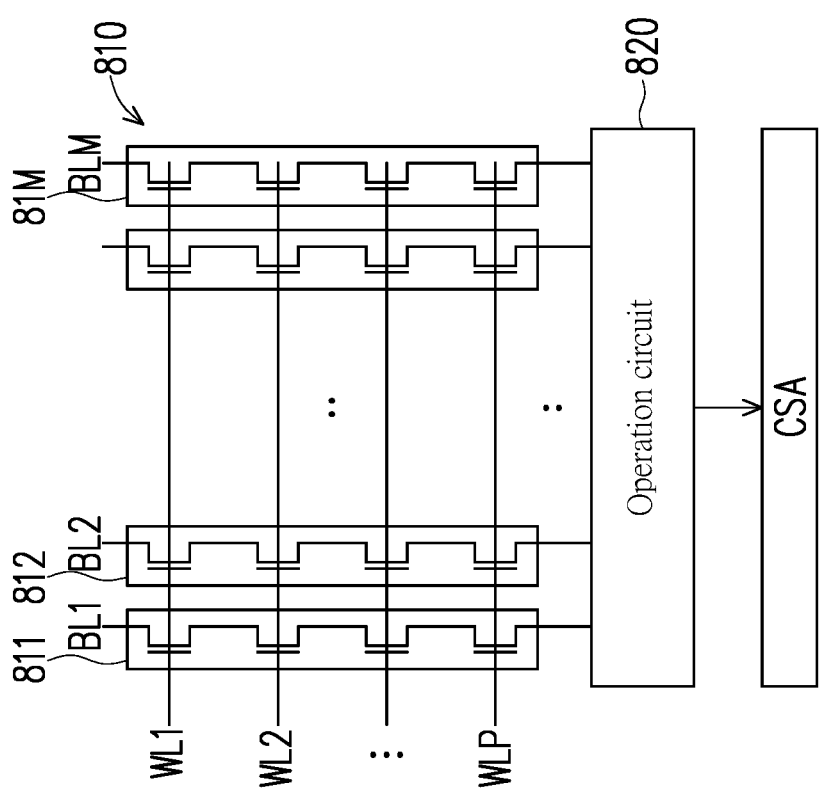
FIG. 8A and FIG. 8B are schematic views illustrating an implementation manner of an associative memory array in a hyperdimensional computing device according to an embodiment of the disclosure.
Figure 8B:
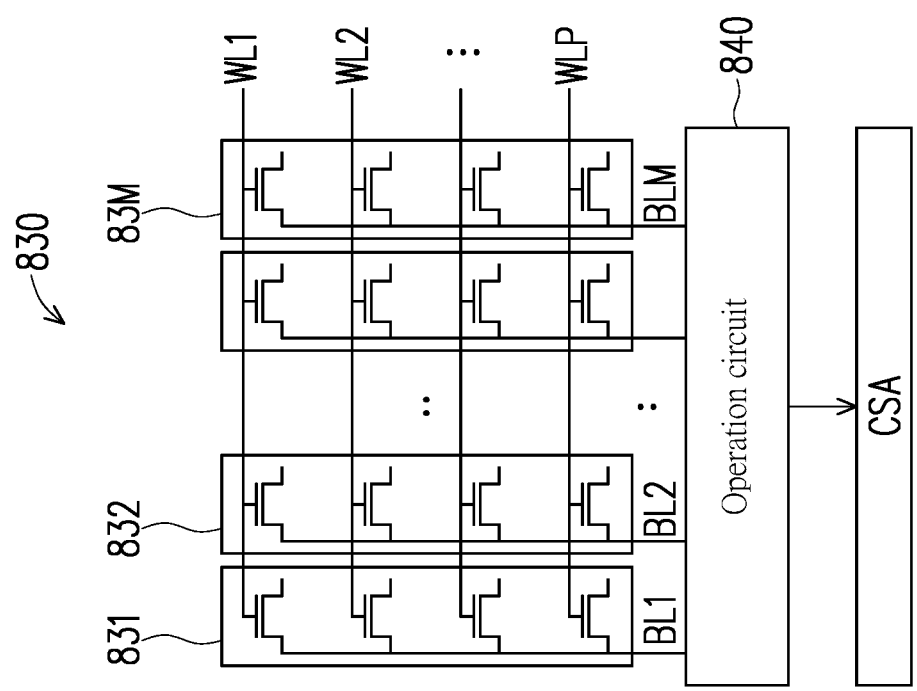

Implementation details of the associative memory array 730 may be referred to as those of the associative memory array of the hyperdimensional computing device schematically illustrated in FIG. 8A and FIG. 8B according to an embodiment of the disclosure. In FIG. 8A, an associative memory array 810 and an operation circuit 820 are coupled to each other. The associative memory array 810 has a plurality of memory cell groups 811-81M. Each of the memory cell groups 811-81M has a plurality of memory cells, and the memory cells in the same memory cell group are commonly coupled to the same bit line. Here, the memory cell groups 811-81M are respectively coupled to the bit lines BL1-BLM. In addition, the memory cells in the same memory cell string 811-81M are respectively coupled to a plurality of different word lines WL1-WLP. Here, in this embodiment, the memory cells in the memory cell groups 811-81M are NAND flash memory cells.

Corresponding to the embodiment illustrated in FIG. 7, the associative memory array 810 compares the bundled data vector BHV generated by the operation circuit 720 with the classification information in each of the memory cell groups 811-81M to perform the IMS operation. The operation circuit 820 may generate the optimal similar result CSA closest to the bundled data vector BHV according to the aforesaid IMS operation.

In FIG. 8B, the associative memory array 830 and the operation circuit 840 are coupled to each other. The associative memory array 830 has a plurality of memory cell groups 831-83M. Each of the memory cell groups 831-83M has a plurality of memory cells, and the memory cells in the same memory cell group are commonly coupled to the same bit line. Here, the memory cell groups 831-83M are respectively coupled to the bit lines BL1-BLM. In addition, the memory cells in the same memory cell groups 831-83M are respectively coupled to a plurality of different word lines WL1-WLP. Here, in this embodiment, the memory cells in the memory cell groups 831-83M are NOR flash memory cells.

The associative memory array 840 compares the bundled data vector BHV generated by the operation circuit 720 with the classification information in each of the memory cell groups 831-83M to perform the IMS operation. The operation circuit 840 may generate the optimal similar result CSA closest to the bundled data vector BHV according to the aforesaid (IMS operation.

The details of the IMS operation provided in the previous embodiments may be implemented in form of the common IMS operation well known to people having ordinary skill in the pertinent art and should not be construed as a limitation in the disclosure.

To sum up, in the hyperdimensional computing device provided in one or more embodiments of the disclosure, the non-volatile memory cell array is applied to store all the possible data vectors during the computations. One or more data vectors are combined by the operation circuit through turning on the required word lines, so as to generate the bundled data vector. As such, the circuit complexity of the hyperdimensional computing device may be effectively simplified, the work speed of the hyperdimensional computing device may be increased, and the system performance may be effectively improved.

What is claimed is:

1. A hyperdimensional computing device, comprising:
   a non-volatile memory cell array, coupled to a plurality of first word lines, the memory cell array having a plurality of first memory cell groups, a plurality of first memory cells of each of the first memory cell groups being coupled to a same first word line of the first word lines, the first memory cell groups respectively storing a plurality of data vectors; and
   a first operation circuit, coupled to a plurality of first bit lines of the non-volatile memory cell array, receiving at least one of the data vectors through the bit lines, and generating a bundled data vector according to the at least one of the data vectors,
   wherein each of the data vectors is an n-gram vector, and the data vectors comprise all permutations and combinations of a plurality of characters.

2. The hyperdimensional computing device according to claim 1, further comprising an encoder generating the n-gram vectors and respectively storing the n-gram vectors into the first memory cell groups.

3. The hyperdimensional computing device according to claim 1, further comprising:
   a word line driver, turning on a plurality of selected word lines of the first word lines according to input data.

4. The hyperdimensional computing device according to claim 3, wherein the word line driver turns on each of the selected word lines one by one.

5. The hyperdimensional computing device according to claim 4, wherein the operation circuit is a counter.

6. The hyperdimensional computing device according to claim 3, wherein the word line driver synchronously turns on the selected word lines.

7. The hyperdimensional computing device according to claim 6, wherein the operation circuit is a sensing amplifier.

8. A hyperdimensional computing device, comprising:
a non-volatile memory cell array, coupled to a plurality of first word lines, the memory cell array having a plurality of first memory cell groups, a plurality of first memory cells of each of the first memory cell groups being coupled to a same first word line of the first word lines, the first memory cell groups respectively storing a plurality of data vectors; and
a first operation circuit, coupled to a plurality of first bit lines of the non-volatile memory cell array, receiving at least one of the data vectors through the bit lines, and generating a bundled data vector according to the at least one of the data vectors, wherein the data vectors respectively comprise a plurality of possible component information and a plurality of position information corresponding to a graphic image.

9. The hyperdimensional computing device according to claim 8, wherein the operation circuit generates the bundled data vector according to a plurality of selected component information and the position information respectively corresponding to the selected component information.

10. The hyperdimensional computing device according to claim 8, further comprising:
an associative memory array, coupled to the operation circuit and configured to store a plurality of classification vectors, the associative memory array having a plurality of second memory cell groups, a plurality of second memory cells of each of the second memory cell groups being respectively coupled to a plurality of second word lines, the second memory cell groups being respectively coupled to a plurality of second bit lines, wherein the associative memory array receives the bundled data vector and performs an in-memory-searching operation according to the bundled data vector; and
a second operation circuit, coupled to the associative memory to generate an optimal similar result according to the in-memory-searching operation.

11. The hyperdimensional computing device according to claim 10, wherein the second operation circuit generates the optimal similar result according to a current value of each of the second word lines.

12. The hyperdimensional computing device according to claim 11, wherein the second operation circuit generates the optimal similar result according to one of the second word lines having a maximum current value.

13. The hyperdimensional computing device according to claim 10, wherein the associative memory array is a NAND flash memory or a NOR flash memory.

14. The hyperdimensional computing device according to claim 1, wherein the non-volatile memory cell array is a NAND flash memory or a NOR flash memory.

* * * * *